United States Patent
Matsumoto et al.

(10) Patent No.: US 6,509,254 B1
(45) Date of Patent: Jan. 21, 2003

(54) METHOD OF FORMING ELECTRODE STRUCTURE AND METHOD OF FABRICATING SEMICONDUCTOR DEVICE

(75) Inventors: Michikazu Matsumoto, Kyoto (JP); Naohisa Sengoku, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/680,053

(22) Filed: Oct. 5, 2000

(30) Foreign Application Priority Data

Jan. 20, 2000 (JP) ........................... 2000-011447

(51) Int. Cl.$^7$ .......................... H01L 21/3205
(52) U.S. Cl. ...................... 438/591; 438/592
(58) Field of Search ........................ 438/195, 209, 438/210, 446, 585, 591, 592, 595, 647, 648, 653, 652

(56) References Cited

U.S. PATENT DOCUMENTS

| 5,604,140 A | * | 2/1997 | Byun ........................ 438/253 |
| 5,736,455 A | * | 4/1998 | Iyer et al. .................. 438/592 |
| 5,858,831 A | * | 1/1999 | Sung ........................ 438/241 |
| 5,874,353 A | * | 2/1999 | Lin et al. .................. 257/413 |
| 5,880,508 A | * | 3/1999 | Wu ........................... 257/368 |
| 5,962,904 A | * | 10/1999 | Hu ........................... 257/412 |
| 6,080,645 A | * | 6/2000 | Pan .......................... 438/585 |
| 6,277,719 B1 | * | 8/2000 | Chern et al. ................ 438/585 |
| 6,146,742 A | * | 11/2000 | Hsieh et al. ................ 428/195 |
| 6,198,144 B1 | * | 3/2001 | Pan et al. .................. 257/412 |

FOREIGN PATENT DOCUMENTS

| JP | 07-235542 |   | 9/1995 |             |
| JP | 11068095  | * | 3/1999 | H01L/29/78 |
| JP | 11068095 A | * | 3/1999 | H01L/29/78 |

* cited by examiner

Primary Examiner—Wael Fahmy
Assistant Examiner—Brook Kebede
(74) Attorney, Agent, or Firm—Nixon Peabody LLP; Thomas W. Cole

(57) ABSTRACT

After depositing a first metal film of a first metal on a silicon-containing film including silicon as a main component, a second metal film of a nitride of a second metal is deposited on the first metal film. Then, a high-melting-point metal film is deposited on the second metal film, so as to form an electrode structure including the silicon-containing film, the first metal film, the second metal film and the high-melting-point metal film. The electrode structure is then subjected to a heat treatment at 750° C. or more. The first metal film has such a thickness that the first metal is nitrided to be changed into a nitride of the first metal and a silicide layer of the first metal is not formed in a surface portion of the silicon-containing film after the heat treatment.

11 Claims, 11 Drawing Sheets

METHOD OF FORMING ELECTRODE STRUCTURE AND METHOD OF FABRICATING SEMICONDUCTOR DEVICE

BACKGROUND OF THE INVENTION

The present invention relates to a method of forming an electrode structure including a lower layer of polysilicon or amorphous silicon and an upper layer of a high-melting-point metal, and a method of fabricating a semiconductor device including a gate electrode formed from the electrode structure.

In a conventional MOS transistor, a gate electrode is formed from a polysilicon film. In accordance with improvement of LSIs in refinement and high speed operation, there are increasing demands for lowering the resistance of the gate electrode of a MOS transistor.

Therefore, as technique to lower the resistance of the gate electrode, a polymetal gate electrode having a laminated structure including a lower polysilicon film and an upper high-melting-point metal film has been proposed to be used as the gate electrode, and a tungsten film has been proposed as the upper high-melting-point metal film. By using a tungsten film as the upper high-melting-point metal film, the resistance value of the gate electrode can be lowered.

It is necessary to form a barrier film of tungsten nitride ($WN_x$) or titanium nitride (TiN) between a polysilicon film and a tungsten film in order to prevent an impurity (such as B, P and As) introduced into the polysilicon film from diffusing into the tungsten film (as disclosed in, for example, Japanese Laid-Open Patent Publication No. 11-261059 or 7-235542).

FIG. 8(a) is a sectional view of an electrode structure of a first conventional example. As is shown in FIG. 8(a), a gate electrode is formed on a semiconductor substrate 1 with a gate insulating film 2 sandwiched therebetween, and the gate electrode includes a polysilicon film 3, a barrier film 4A of tungsten nitride ($WN_x$) and a tungsten film 5 successively formed upward.

FIG. 8(b) is a sectional view of an electrode structure of a second conventional example. As is shown in FIG. 8(b), a gate electrode is formed on a semiconductor substrate 1 with a gate insulating film 2 sandwiched therebetween, and the gate electrode includes a polysilicon film 3, a barrier film 4B of titanium nitride (TiN) and a tungsten film 5 successively formed upward.

In the electrode structure of the first conventional example, a heat treatment conducted in a later procedure evaporates nitrogen included in the barrier film 4A of tungsten nitride, so that the barrier film 4A can be changed into the tungsten film 5. In addition, nitrogen included in the barrier film 4A reacts with silicon included in the polysilicon film 3, so that a reaction layer 6 of silicon nitride (SiN) having a very large resistance value can be formed between the polysilicon film 3 and the tungsten film 5 as is shown in FIG. 8(c). As a result, the resistance value of the gate electrode is disadvantageously increased.

Therefore, Japanese Laid-Open Patent Publication No. 7-235542 describes that the sheet resistance of the reaction layer 6 can be reduced to lower the resistance value of the gate electrode by setting the surface density of nitrogen included in the reaction layer 6 of silicon nitride to a predetermined value or less.

The present inventors have found, however, that the resistance value of the gate electrode cannot be lowered even by setting the surface density of nitrogen included in the reaction layer 6 to the predetermined value or less in the electrode structure of the first conventional example.

Therefore, the reason why the resistance value of the gate electrode cannot be lowered in the first example has variously examined to find the following: When the thickness of the barrier film 4A is reduced to approximately 0.1 through 1.0 nm in order to reduce the surface density of nitrogen included in the reaction layer 6, the barrier film 4A cannot exhibit the barrier function. Accordingly, tungsten silicide ($WSi_x$) is formed, so that the resistance value of the gate electrode cannot be lowered. When the thickness of the barrier film 4A is increased to exceed 1.0 nm, although the barrier film 4A can exhibit the barrier function, the reaction layer 6 of silicon nitride having a very large resistance value is formed between the polysilicon film 3 and the tungsten film 5. Accordingly, the interface resistance value between the polysilicon film 3 and the tungsten film 5 is increased.

As another problem, since a tungsten nitride film is poor at heat resistance, a great deal of nitrogen included in the tungsten nitride film can be diffused through a heat treatment conducted at a temperature. of 750° C. or more, so that the tungsten nitride film can be changed into a tungsten film.

In the case where a barrier film of titanium nitride is used as in the second conventional method, the interface resistance value between the polysilicon film 3 and the tungsten film 5 is increased owing to the reaction layer 6 of silicon nitride having a very large resistance value formed between the polysilicon film and the tungsten film for the reason described below.

First, as is shown in FIG. 9(a), a polysilicon film 3 is formed on a semiconductor substrate 1 with a gate insulating film 2 sandwiched therebetween. The polysilicon film 3 is doped with a p-type impurity such as boron when a p-type gate electrode is to be formed, and is doped with an n-type impurity such as phosphorus when an n-type gate electrode is to be formed. Next, in order to deposit a titanium nitride film 4B on the polysilicon film 3, the semiconductor substrate 1 is loaded within a chamber where a titanium target 7 including titanium as a main component is placed, and a mixed gas including argon and nitrogen is introduced into the chamber and discharge is caused within the chamber. In this manner, plasma of the argon gas and the nitrogen gas is generated, so that a reaction layer 6 of silicon nitride can be formed in a surface portion of polysilicon film 3 through a reaction between nitrogen ions of the plasma and silicon of the polysilicon film 3. Furthermore, the titanium target 7 is nitrided so as to form a titanium nitride film 8 thereon, and titanium nitride is sputtered out from the titanium nitride film 8. As a result, the barrier film 4B of titanium nitride is formed on the reaction layer 6 as is shown in FIG. 9(b).

Then, the semiconductor substrate 1 is transferred to a chamber where a tungsten target 9 including tungsten as a main component is placed, and an argon gas is introduced into the chamber and discharge is caused within the chamber. In this manner, plasma of the argon gas is generated, so that tungsten can be sputtered out from the tungsten target 9 through sputtering of argon ions included in the plasma. The sputtered tungsten is deposited on the surface of the titanium nitride film 4B, and thus, a tungsten film 5 is formed on the titanium nitride film 4B as is shown in FIG. 9(c).

Next, an impurity layer to be formed into a source or drain of a MOS transistor is formed in the semiconductor substrate 1, and a heat treatment is carried out for activating the impurity layer at a temperature of, for example, 750° C. or more. In this manner, as is shown in FIG. 10(a), excessive nitrogen included in the barrier film 4B is diffused into an upper portion of the polysilicon film 3. As a result, the reaction layer 6 of titanium nitride is increased in its thickness as is shown in FIG. 10(b).

Moreover, the present inventors have examined the relationship between the temperature of the heat treatment and the interface resistance of the barrier film after the heat treatment. FIG. 11 shows the relationship between the temperature (° C.) of the heat treatment and the interface resistance ($R_c$) between the polysilicon film and the high-melting-point metal film after the heat treatment. In FIG. 11, a symbol (●) indicates the result obtained when a barrier film of tungsten nitride ($WN_x$) is formed on an n-type polysilicon film (indicated as NPS); a symbol (○) indicates the result obtained when a barrier film of tungsten nitride is formed on a p-type polysilicon film (indicated as PPS); a symbol (♦) indicates the result obtained when a barrier film of titanium nitride (TiN) is formed on an n-type polysilicon film; and a symbol (◊) indicates the result obtained when a barrier film of titanium nitride is formed on a p-type polysilicon film. Furthermore, the resistance shown in FIG. 11 is not ohmic resistance, and hence, a resistance value obtained by allowing a current of 1 mA/$\mu$m² to flow is shown as interface resistance.

It is understood from FIG. 11 that in using the barrier film 4B of titanium nitride, the interface resistance is high even when the heat treatment is conducted at a low temperature. Furthermore, the present inventors have found through experiments that in using the barrier film 4B of titanium nitride, the interface resistance is high even when the heat treatment is not conducted. This is because the reaction layer 6 of titanium nitride is formed between the polysilicon film 3 and the barrier film 4B as is shown in FIGS. 9(a) through 9(c).

Also, when the barrier film 4A of tungsten nitride is used, although the interface resistance is lower than in using the barrier film 4B of titanium nitride, the interface resistance is abruptly increased through a heat treatment conducted at 750° C. or more. This is because nitrogen included in tungsten nitride of the barrier film 4A is diffused through the heat treatment conducted at 750° C. or more, so as to form the reaction layer 6 of silicon nitride between the polysilicon film 3 and the tungsten film 5.

As the interface resistance ($R_c$) between the polysilicon film 3 and the tungsten film 5 is increased, the operation speed of the MOS transistor is lowered. Specifically, when the gate electrode is AC operated, distributed capacity generated in the gate insulating film is repeatedly charged and discharged. Therefore, a current flows through the distributed interface resistance, so that the distributed interface resistance can affect to lower the operation speed of the MOS transistor. When the operation speed of the MOS transistor is lowered, the operation speed of an LSI including the MOS transistor is lowered, which causes a problem that signal delay time is increased. Since the operation speed of an LSI is regarded the most significant these days, degradation in the operation speed of the MOS transistor by merely several % can cause a serious problem.

In order to avoid the interface resistance from affecting the delay time of the MOS transistor, the interface resistance should be reduced to 300 $\Omega\mu$m² of less.

SUMMARY OF THE INVENTION

In consideration of the aforementioned conventional problems, an object of the invention is lowering interface resistance between a polysilicon film and a high-melting-point metal film.

In order to achieve the object, the method of forming an electrode structure of this invention comprises the steps of depositing a first metal film of a first metal on a silicon-containing film including silicon as a main component; depositing a second metal film of a nitride of a second metal on the first metal film; depositing a high-melting-point metal film on the second metal film, whereby obtaining an electrode structure including the silicon-containing film, the first metal film, the second metal film and the high-melting-point metal film; and conducting a heat treatment on the electrode structure at a temperature of 750° C. or more, and the first metal film has such a thickness that the first metal is nitrided to be changed into a nitride of the first metal and a silicide layer of the first metal is not formed in a surface portion of the silicon-containing film after the heat treatment.

In the present method of forming an electrode structure, the barrier film including the lower first metal film of the first metal and the upper second metal film of the nitride of the second metal is disposed between the silicon-containing film and the high-melting-point metal film. In addition, the thickness of the first metal film is set to such a value that the first metal is nitrided by nitrogen included in the second metal film to be changed into the nitride of the first metal and a silicide layer of the first metal is not formed in the surface portion of the silicon-containing film after the heat treatment. As a result, the interface resistance between the silicon-containing film and the high-melting-point metal film can be largely lowered for the following reason: Most of the nitrogen included in the second metal film is consumed in nitriding the first metal film and merely little nitrogen included in the second metal film is concerned with nitriding of the silicon-containing film. Therefore, a reaction layer of a silicon nitride film having a very large resistance value formed between the silicon-containing film and the metal nitride film has such a small thickness that the interface resistance can be lowered.

In the method of forming an electrode structure of this invention, no silicon nitride film or a silicon nitride film with a thickness of 1.5 nm or less is preferably formed between the silicon-containing film and the first metal film after the heat treatment.

In this manner, the interface resistance between the silicon-containing film and the high-melting-point metal film can be suppressed to 300 $\Omega\mu$m² or less. As a result, the delay time of a MOS transistor including a gate electrode formed from the electrode structure of this invention can be largely reduced.

In the method of forming an electrode structure of this invention, interface resistance between the silicon-containing film and the high-melting-point metal film is preferably 300 $\Omega\mu$m² or less after the heat treatment.

In this manner, the delay time of a MOS transistor including a gate electrode formed from the electrode structure of this invention can be largely reduced.

In the method of forming an electrode structure of this invention, it is preferred that the first metal and the second metal are the same metal, that the first metal film is deposited by sputtering using a target of the same metal, and that the second metal film is deposited by sputtering of a nitride film of the same metal formed on the target.

In this manner, the first metal film and the second metal film can be continuously deposited by using a target of the same metal by merely changing the kind of gas to be introduced, resulting in improving the throughput.

In the method of forming an electrode structure of this invention, the first metal and the second metal are preferably both titanium.

In the method of forming an electrode structure of this invention, the nitride of the second metal can be titanium nitride, tungsten nitride, tantalum nitride or tungsten silicide nitride.

In order to achieve the aforementioned object, the method of fabricating a semiconductor device of this invention comprises the steps of depositing a polysilicon film on a semiconductor region; depositing a first metal film of a first metal on the polysilicon film; depositing a second metal film of a nitride of a second metal on the first metal film; depositing a high-melting-point metal film on the second metal film, whereby forming a gate electrode including the polysilicon film, the first metal film, the second metal film and the high-melting-point metal film; forming an impurity layer serving as a source or drain by ion implantation of an impurity with the gate electrode used as a mask; and conducting a heat treatment at a temperature of 750° C. or more for activating the impurity layer, and the first metal film has such a thickness that the first metal is nitrided to be changed into a nitride of the first metal and a silicide layer of the first metal is not formed in a surface portion of the polysilicon film after the heat treatment.

In the present method of fabricating a semiconductor device, a semiconductor device is fabricated by using the method of forming an electrode structure of this invention. Therefore, the interface resistance between the polysilicon film and the high-melting-point metal film in the gate electrode can be very low even when the heat treatment for activating the impurity layer serving as a source or drain is conducted at 750° C. or more. Accordingly, the delay time of the MOS transistor can be reduced, so as to increase the operation speed of the MOS transistor.

In the method of fabricating a semiconductor device of this invention, no silicon nitride film or a silicon nitride film with a thickness of 1.5 nm or less is preferably formed between the polysilicon film and the first metal film after the heat treatment.

In this manner, the delay time of the MOS transistor can be largely reduced.

In the method of fabricating a semiconductor device of this invention, the first metal and the second metal are preferably both titanium.

DETAILED DESCRIPTION OF THE INVENTION

Embodiment 1

As a method of forming an electrode structure according to Embodiment 1, formation of a gate electrode will now be described with reference to FIGS. 1(a) through 1(c) and 2(a) through 2(c).

Figure 1A:
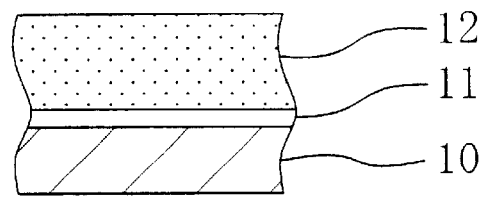
FIGS. 1(a), 1(b) and 1(c) are cross-sectional views for showing procedures in a method of forming an electrode structure according to Embodiment 1.

First, as is shown in FIG. 1(a), a gate insulating film 11 of a silicon oxide film is formed on a silicon substrate 10, and a polysilicon film 12 serving as a lower film of the gate electrode is then deposited on the gate insulating film 11. Thereafter, in forming p-type polysilicon, the polysilicon film 12 is doped with a p-type impurity such as boron, and in forming n-type polysilicon, the polysilicon film 12 is doped with an n-type impurity such as phosphorus. The polysilicon film 12 can be replaced with an amorphous silicon film.

Figure 1B:
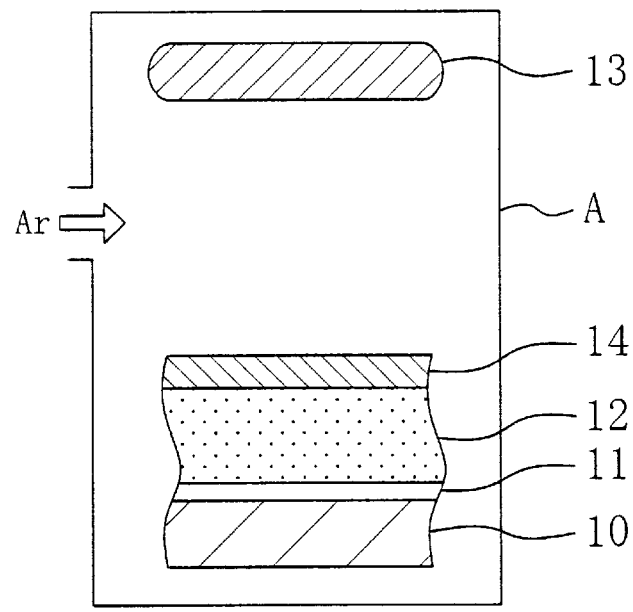

Then, as is shown in FIG. 1(b), the semiconductor substrate 10 is loaded within a chamber A where a titanium target 13 including titanium as a main component is placed, an argon gas is introduced into the chamber A and discharge is caused within the chamber A. In this manner, plasma of the argon gas is generated so that the titanium target 13 can be sputtered by argon ions included in the plasma. As a result, a titanium film 14 serving as a first metal film is deposited on the polysilicon film 12. The thickness of the titanium film 14 will be described in detail below and is specifically, for example, approximately 4.5 nm.

Figure 1C:
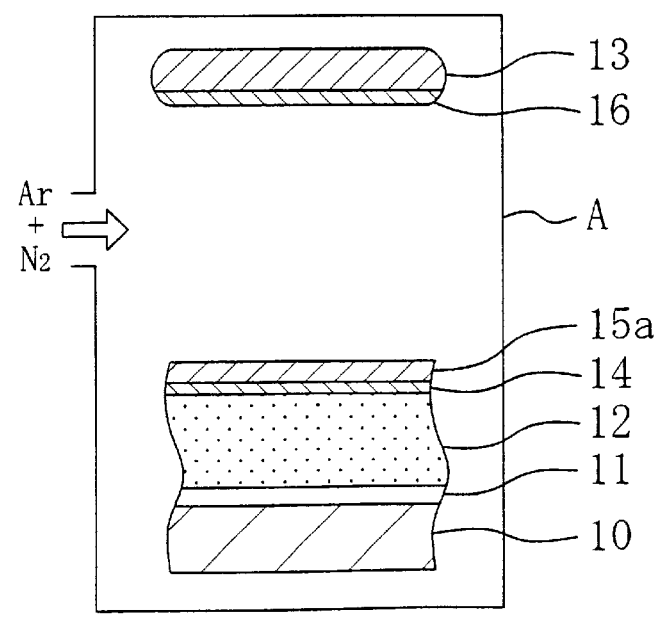

Next, as is shown in FIG. 1(c), a mixed gas including an argon gas and a nitrogen gas is introduced into the chamber A and discharge is caused within the chamber A, so that plasma of the argon gas and the nitrogen gas can be generated. In this manner, the titanium film 14 is nitrided so as to form a first titanium nitride film 15a in a surface portion of the titanium film 14 and the titanium target 13 is also nitrided so as to form a titanium nitride film 16 in a surface portion of the titanium target 13.

Figure 2A:
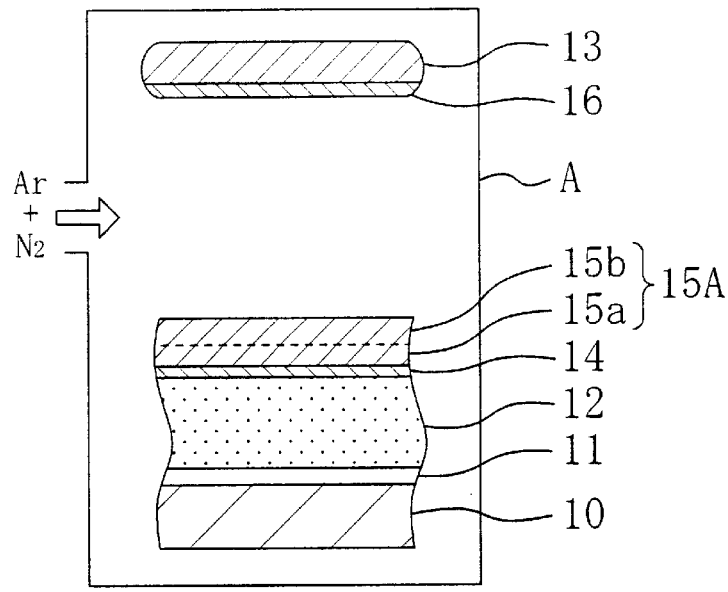
FIGS. 2(a), 2(b) and 2(c) are cross-sectional views for showing other procedures in the method of forming an electrode structure according to Embodiment 1.

Thereafter, the mixed gas including the argon gas and the nitrogen gas is continuously introduced and the discharge is continuously caused within the chamber A. Thus, the titanium nitride film 16 in the surface portion of the titanium target 13 is sputtered by the argon ions, so as to deposit a second titanium nitride film 15b on the first titanium nitride film 15a as is shown in FIG. 2(a). In this manner, a titanium nitride film 15A including the first titanium nitride film 15a and the second titanium nitride film 15b and serving as a second metal film is formed. The titanium film 14 (the first metal film) and the titanium nitride film 15A (the second metal film) together form a barrier film.

According to Embodiment 1, the argon gas is first introduced into the chamber A where the titanium target 13 is placed, so as to deposit the titanium film 14 on the polysilicon film 12. Thereafter, the mixed gas including the argon gas and the nitrogen gas is introduced, so as to form the titanium nitride film 15A on the titanium film 14. Specifically, the titanium film 14 and the titanium nitride film 15A can be continuously formed by merely changing the kind of gas to be introduced into the chamber A without exchanging the titanium target 13.

Figure 2B:
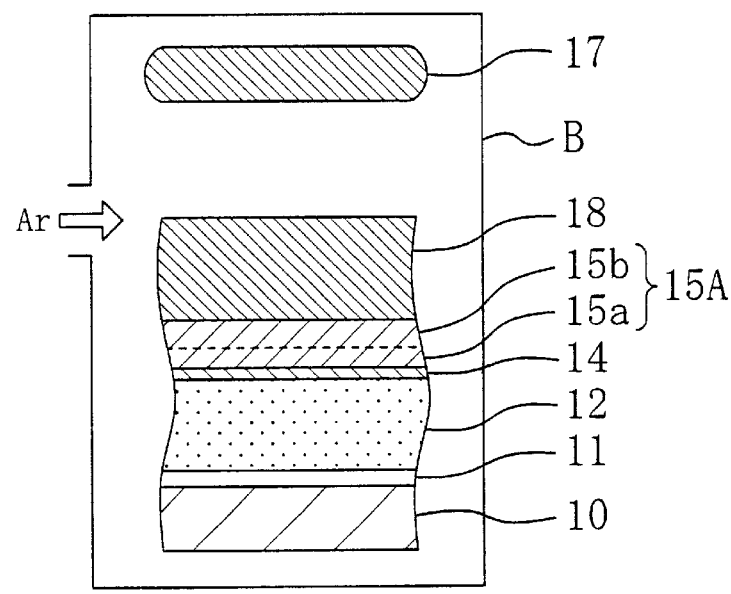
Figure 2C:
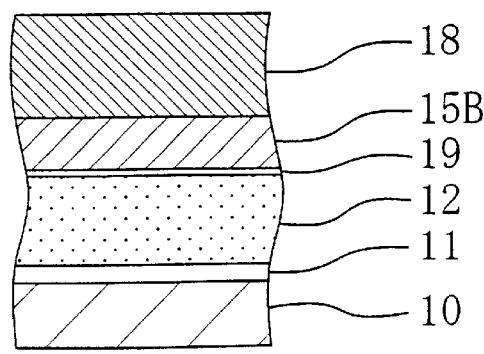

Subsequently, as is shown in FIG. 2(b), the semiconductor substrate 10 is transferred to a chamber B where a tungsten target 17 including tungsten as a main component is placed, an argon gas is introduced into the chamber B and discharge is caused within the chamber B. In this manner, plasma of the argon gas is generated, so that the tungsten target 17 is sputtered by argon ions included in the plasma. As a result, a tungsten film 18 serving as a high-melting-point metal film is deposited on the titanium nitride film 15A. The polysilicon film 12, the titanium film 14, the titanium nitride film 15A and the tungsten film 18 together form a gate electrode formed from the electrode structure of this embodiment.

Next, although not shown in the drawings, an impurity layer serving as a source or drain is formed by doping the semiconductor substrate 10 with an impurity by using the gate electrode as a mask, and a heat treatment is carried out at a temperature of, for example, 750° C. or more so as to activate the impurity.

Owing to the heat treatment, nitrogen present in the titanium nitride film 15A is diffused into the titanium film 14 and the polysilicon film 12. At this point, diffusion of the nitrogen into the titanium film 14 changes the titanium film 14 into a titanium nitride film. Therefore, after the heat treatment, the titanium film 14 is disappeared, and the titanium nitride film into which the titanium film 14 has been changed and the previously formed titanium nitride film 15A together form a titanium nitride film 15B. Also, diffusion of the nitrogen into the polysilicon film 12 results in forming a reaction layer 19 including silicon and nitrogen as main components on the interface between the polysilicon film 12 and the titanium nitride film 15B. The reaction layer 19 sometimes includes atoms of oxygen or the like.

As described above, the reaction layer 19 including silicon and nitrogen as main components has a very large resistance value. Therefore, when the reaction layer 19 has a large thickness, the interface resistance between the polysilicon film 12 and the tungsten film 18 is high.

In Embodiment 1, however, the titanium film 14 is disposed between the polysilicon film 12 and the titanium nitride film 15A, and hence, most of nitrogen included in the titanium nitride film 15A is consumed in nitriding the titanium film 14 with little nitrogen concerned with nitriding of the polysilicon film 12. Therefore, the reaction layer 19 has a remarkably small thickness as compared with that formed in the conventional method. Accordingly, the interface resistance between the polysilicon film 12 and the tungsten film 18 is largely lowered.

Accordingly, the titanium film 14 preferably has such a thickness that the entire titanium film 14 can be changed into a titanium nitride film through diffusion of the nitrogen included in the titanium nitride film 15A into the titanium film 14.

In the case where the thickness of the titanium film 14 is too large to change the entire titanium film 14 into a titanium nitride film, a titanium silicide ($TiSi_2$) layer is formed in a surface portion of the polysilicon film 12 through a reaction between titanium of the titanium film 14 and silicon of the polysilicon film 12. This titanium silicide layer can be a cause of peeling.

On the other hand, in the case where the thickness of the titanium film 14 is too small, although a titanium silicide layer is not formed, a great deal of nitrogen included in the titanium nitride film 15A diffuses into the polysilicon film 12 through the titanium film 14. Therefore, the thickness of the reaction layer 19 is increased, so as to increase the interface resistance between the polysilicon film 12 and the high-melting-point metal film 18.

As described above, in order to avoid the interface resistance between the polysilicon film 12 and the high-melting-point metal film 18 from affecting the delay time of a MOS transistor including the gate electrode, the interface resistance should be 300 $\Omega\mu m^2$ or less.

In order to attain the interface resistance of 300 $\Omega\mu m^2$ or less between the polysilicon film 12 and the high-melting-point metal film 18, the reaction layer 19 of silicon nitride preferably has such a thickness that an ohmic property can appear between the polysilicon film 12 and the titanium nitride film 15B, namely, a thickness of 0 through 1.5 nm, and more preferably of 0 through 1.0 nm.

When the reaction layer 19 has a thickness of 0 nm, the reaction layer 19 is substantially not present. When the reaction layer 19 has a thickness of 0 nm, the resistance of the reaction layer 19 is not present, and hence, the interface resistance between the polysilicon film 12 and the high-melting-point metal film 18 can be further lowered.

In Embodiment 1, the surface portion of the titanium film 14 is nitrided by the plasma of the nitrogen gas, and the nitrogen present in the titanium nitride film 15A is diffused into the titanium film 14 through the heat treatment conducted thereafter, so as to change the titanium film 14 into a titanium nitride film. Instead, the entire titanium film 14 may be nitrided by the plasma of the nitrogen gas so as to be entirely changed into a titanium nitride film. Also in this case, the reaction layer of silicon nitride formed through the reaction between silicon and nitrogen can be suppressed from growing as compared with the case where the titanium film 14 is not deposited. As a result, the interface resistance between the polysilicon film and the high-melting-point metal film can be lowered.

(Characteristics of Electrode Structure Formed by Method of Embodiment 1)

The characteristics of the gate electrode having a polymetal structure formed by the aforementioned method of Embodiment 1 will now be described.

Figure 3:
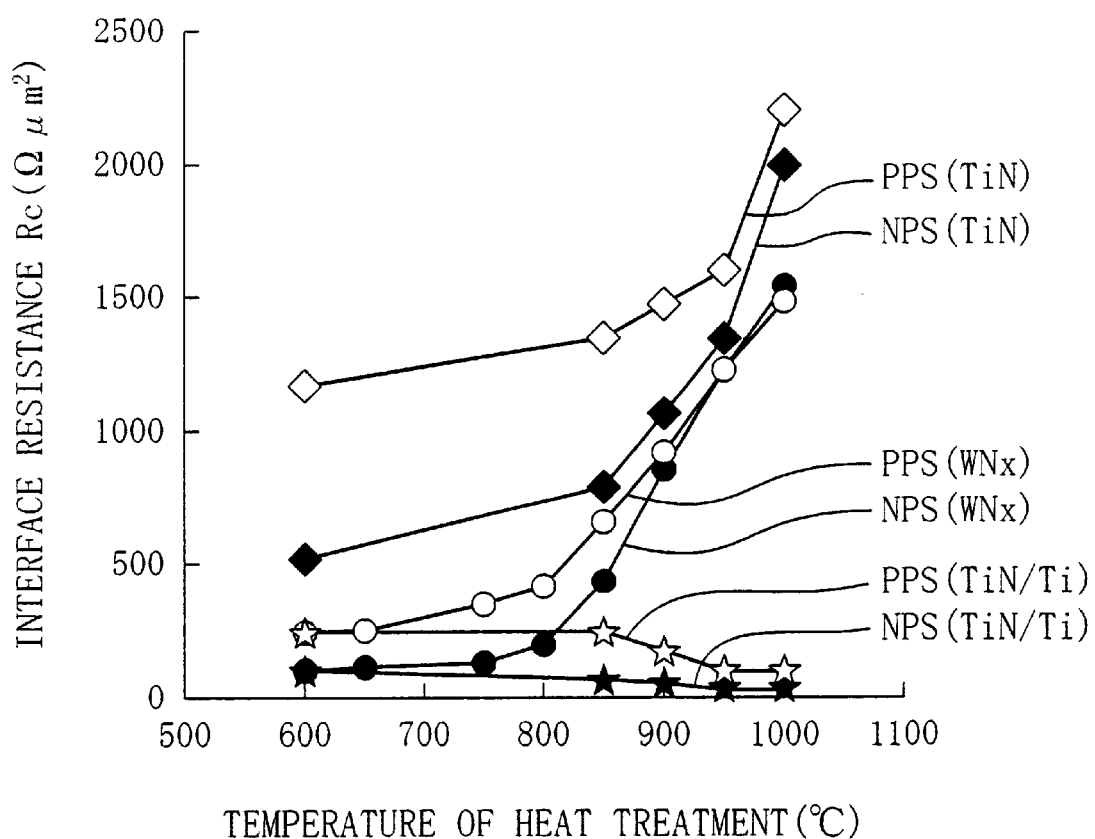
FIG. 3 is a graph for showing the relationship between the temperature of a heat treatment and interface resistance after the heat treatment in gate electrodes formed by methods of forming an electrode structure of Embodiment 1, a first conventional example and a second conventional example.

FIG. 3 shows the relationship between the temperature (° C.) of the heat treatment and the interface resistance ($R_c$) between the polysilicon film and the high-melting-point metal film after the heat treatment conducted on gate electrodes formed by the methods of Embodiment 1, the first conventional example and the second conventional example. In FIG. 3, a symbol (★) indicates the result obtained from a gate electrode of Embodiment 1 (having a structure including a barrier film of a titanium film and a titanium nitride film formed on an n-type polysilicon film (indicated as (NPS)); a symbol (☆) indicates the result obtained from a gate electrode of Embodiment 1 (having a structure including a barrier film of a titanium film and a titanium nitride film formed on a p-type polysilicon film (indicates as PPS)); a symbol (●) indicates the result obtained from a gate electrode of the first example (having a structure including a barrier film of a tungsten nitride film formed on an n-type polysilicon film); a symbol (○) indicates the result obtained from a gate electrode of the first example (having a structure including a barrier film of a tungsten nitride film formed on a p-type polysilicon film); a symbol (♦) indicates the result obtained from a gate electrode of the second conventional example (having a structure including a barrier film of a titanium nitride film formed on an n-type polysilicon film); and a symbol (◇) indicates the result obtained from a gate electrode of the second conventional example (having a structure including a barrier film of a titanium nitride film formed on a p-type polysilicon film). In FIG. 3, since the interface resistance $R_c$ is not ohmic when it exceeds 500 $\Omega \cdot \mu m^2$, a resistance value obtained by allowing a current of 1 $mA/\mu m^2$ to flow is shown as the interface resistance.

As is understood from FIG. 3, the interface resistance is not increased in the gate electrode of Embodiment 1 even when the heat treatment is carried out at approximately 900° C., which is required for forming a transistor. Also, as is shown in FIG. 3, there appears a difference in the interface resistance between the gate electrodes of Embodiment 1 and the first conventional example in conducting the heat treatment at 750° C., this difference in the interface resistance is conspicuous in conducting the heat treatment at 850° C., and the difference is remarkably large in conducting the heat treatment at 900° C. or more.

FIGS. 4(a) through 4(e) show change in the thickness of the reaction layer 19 after the heat treatment with the thickness of the titanium film 14 varied in the method of forming an electrode structure of Embodiment 1, and are sectional views schematically illustrating TEM photographs. In this case, the heat treatment is carried out at 1000° C. for 30 seconds.

Figure 4A:
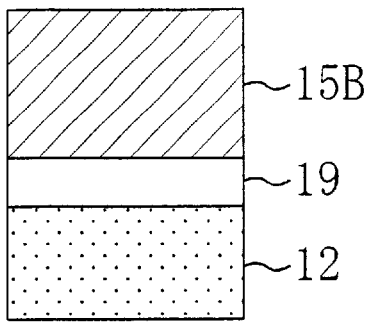
FIGS. 4(a), 4(b), 4(c), 4(d) and 4(e) are cross-sectional views for showing change in the thickness of a reaction layer formed through a heat treatment with the thickness of a titanium film varied in the method of forming an electrode structure of Embodiment 1.
Figure 4B:
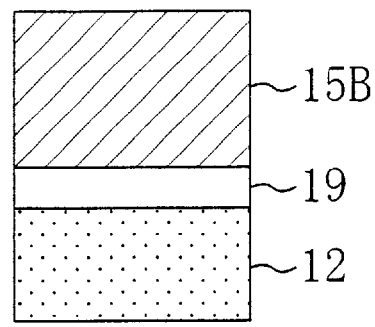
Figure 4C:
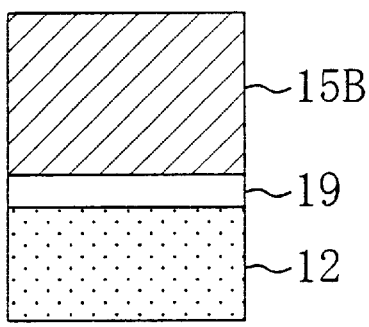
Figure 4D:
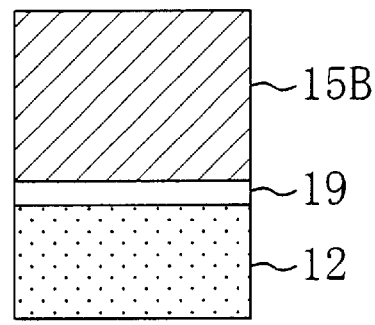
Figure 4E:
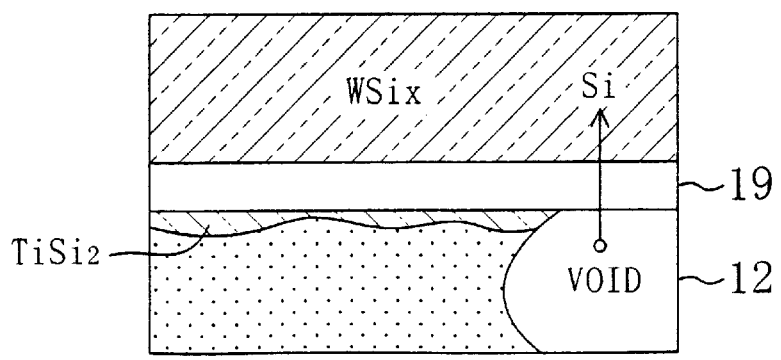

FIG. 4(a) shows the reaction layer formed when the titanium film has a thickness of 0 nm, FIG. 4(b) shows the reaction layer formed when the titanium film has a thickness of 2.5 nm, FIG. 4(c) shows the reaction layer formed when the titanium film has a thickness of 3.5 nm, FIG. 4(d) shows the reaction layer formed when the titanium film has a thickness of 4.5 nm, and FIG. 4(e) shows the reaction layer formed when the titanium film has a thickness of 10.0 nm.

As is understood from FIGS. 4(a) through 4(d), as the thickness of the titanium film increases, the thickness of the reaction layer 19 of silicon nitride decreases. In particular, when the thickness of the titanium film is 4.5 nm, the reaction layer 19 has a thickness of 1 nm or less, resulting in largely lowering the interface resistance.

Also, as is understood from FIG. 4(e), when the titanium film has a thickness of 10.0 nm, silicon atoms included in the polysilicon film is diffused, during the heat treatment, through the titanium nitride film into the tungsten film, so as to form a tungsten suicide ($WSi_x$) layer. The tungsten silicide layer is formed through the following mechanism: Since the titanium film has a large thickness, a titanium silicide ($TiSi_2$) layer is formed before the heat treatment through a reaction between titanium atoms of the titanium film and silicon atoms of the polysilicon film. Probably, the titanium silicide layer is aggregated through the high temperature heat treatment so as to form gaps in the titanium nitride film, and the silicon atoms of the polysilicon film pass through the gaps of the titanium nitride film to reach the tungsten film (see J. Appl. Phys. 62(4), Aug. 15, 1987, p. 1265). When this phenomenon occurs, voids are formed in the polysilicon film on traces of the diffusion of the silicon atoms, resulting in causing peeling between the polysilicon film and the tungsten film. Accordingly, the thickness of the titanium film should be 8 nm or less.

Embodiment 2

A method of fabricating a semiconductor device according to Embodiment 2 of the invention will now be described with reference to FIGS. 5(a), 5(b), 6(a) and 6(b).

Figure 5A:
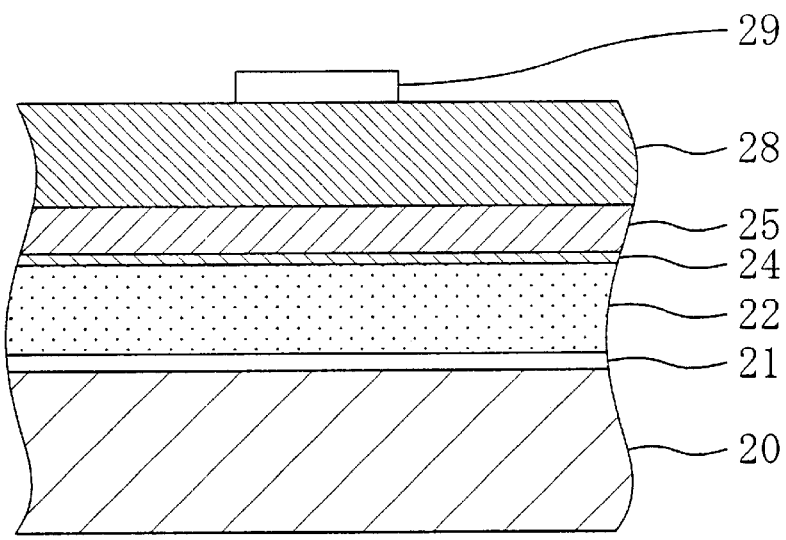
FIGS. 5(a) and 5(b) are cross-sectional views for showing procedures in a method of fabricating a semiconductor device according to Embodiment 2.

First, as is shown in FIG. 5(a), a silicon oxide film 21 to be formed into a gate insulating film is formed on a semiconductor substrate 20, and a polysilicon film 22 is then deposited on the silicon oxide film 21.

Next, in the same manner as described in Embodiment 1, a titanium film 24 and a titanium nitride film 25 together serving as a barrier film are successively formed on the polysilicon film 22, and then a tungsten film 28 is deposited on the titanium nitride film 25. Thus, a laminated structure including the polysilicon film 22, the titanium film 24, the titanium nitride film 25 and the tungsten film 28 is formed. Thereafter, a hard mask 29 of a silicon nitride film for forming a gate electrode is formed on the laminated structure.

Figure 5B:
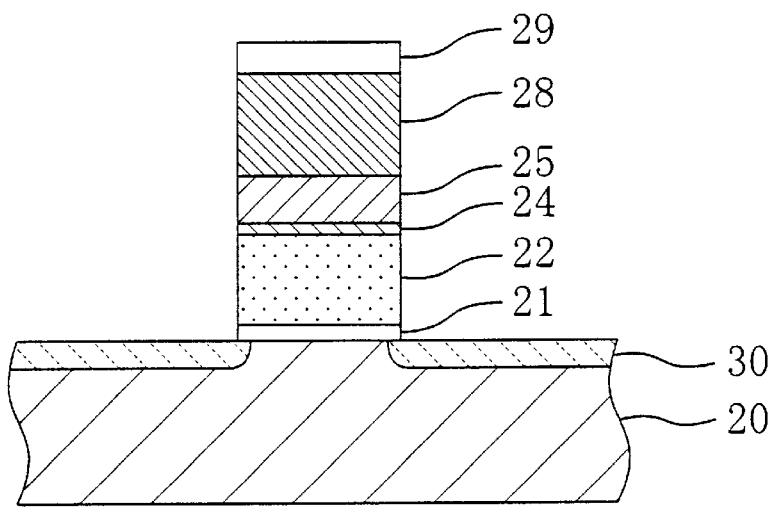

Subsequently, as is shown in FIG. 5(b), the laminated structure is etched by using the hard mask 29, so as to form the gate electrode from the laminated structure, and the gate electrode is cleaned. In this case, since the tungsten film 28 is disposed as an upper film in the gate electrode, a cleaner that does not dissolve tungsten is used for the cleaning. Specifically, since aqueous hydrogen peroxide dissolves tungsten, diluted hydrofluoric acid (HF) is preferably used as the cleaner.

A titanium silicide ($TiSi_2$) layer has a property to be dissolved in diluted hydrofluoric acid. Therefore, when a titanium silicide layer is formed between the polysilicon film 22 and the titanium nitride film 25, side etching is caused in a region between the polysilicon film 22 and the titanium nitride film 25. According to Embodiment 2, however, although diluted hydrofluoric acid is used for the cleaning, the region between the polysilicon film 22 and the titanium nitride film 25 is free from side etching. This reveals that the entire titanium film 24 is changed into a titanium nitride film so as not to form a titanium silicide layer between the polysilicon film 22 and the titanium nitride film 25.

Figure 6A:
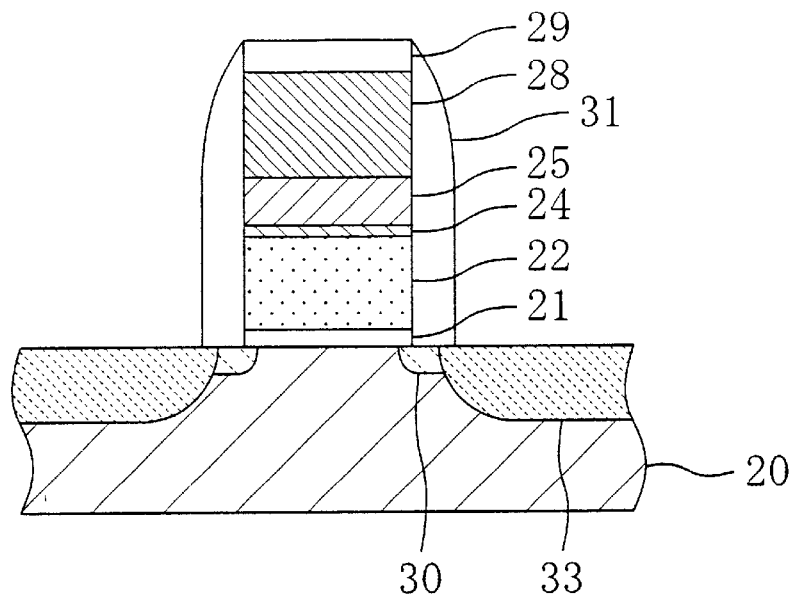
FIGS. 6(a) and 6(b) are cross-sectional views for showing other procedures in the method of fabricating a semiconductor device of Embodiment 2.

Next, the semiconductor substrate 20 is doped with an impurity by using the gate electrode as a mask, thereby forming a low concentration impurity layer 30. Then, a silicon nitride film is deposited on the entire semiconductor substrate 20, and the silicon nitride film is subjected to anisotropic etching. As a result, as is shown in FIG. 6(a), a sidewall 31 is formed on the side face of the gate electrode. Next, the semiconductor substrate 20 is doped with an impurity by using the gate electrode and the sidewall 31 as a mask, thereby forming a high concentration impurity layer 33.

Subsequently, the semiconductor substrate 20 is subjected to a hat treatment at a temperature of 750° C. or more, so as to activate the low concentration impurity layer 30 and the high concentration impurity layer 33.

Figure 6B:
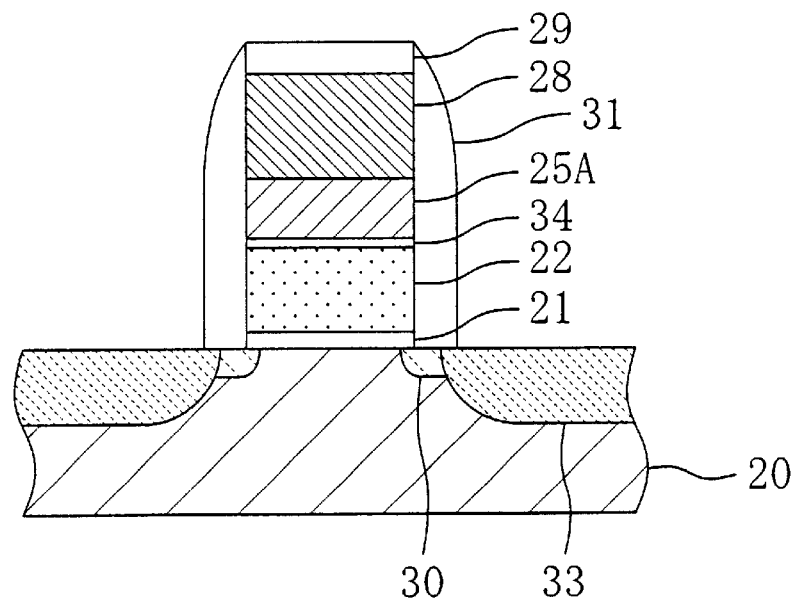

Owing to the heat treatment, nitrogen present in the titanium nitride film 25 is diffused into the titanium film 24 and the polysilicon film 22. Therefore, as is shown in FIG. 6(b), after the heat treatment, a titanium nitride film into which the titanium film 24 has been changed and the previously formed titanium nitride film 25 together form a titanium nitride film 25A. Also, a reaction layer 34 including silicon and nitrogen as main components is formed on the interface between the polysilicon film 22 and the titanium nitride film 25A.

Figure 7A:
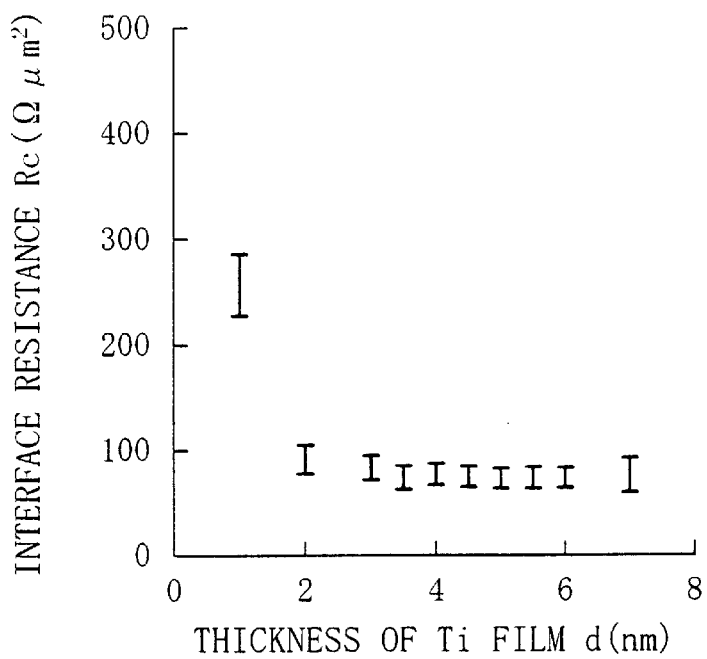
FIGS. 7(a) and 7(b) are diagrams for showing the relationship between the thickness of a titanium film and interface resistance after a heat treatment in the method of fabricating a semiconductor device of Embodiment 2.
Figure 7B:
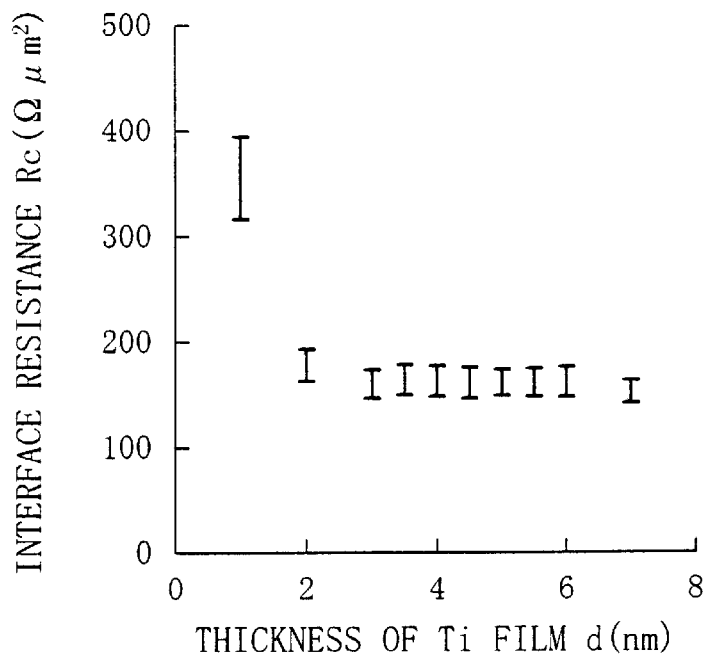
Figure 8A:
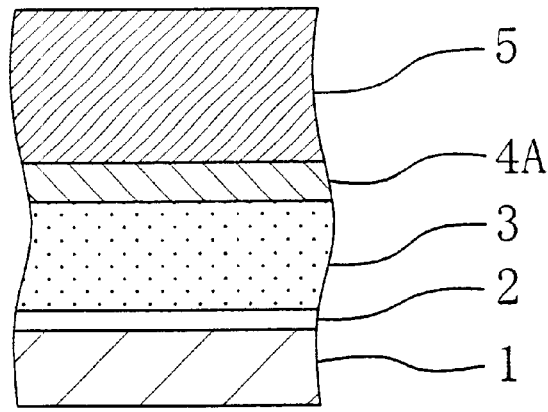
FIG. 8(a) is a cross-sectional view of an electrode structure according to the first conventional example.
Figure 8B:
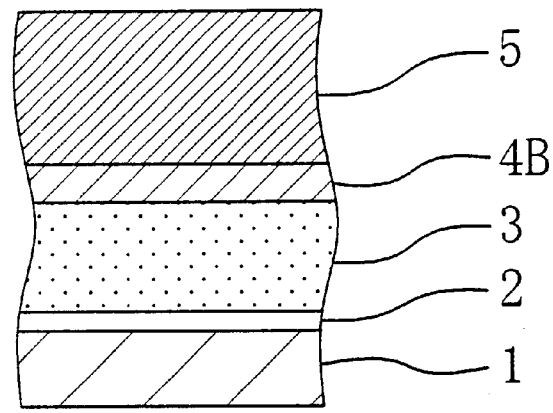
FIG. 8(b) is a cross-sectional view of an electrode structure according to the second conventional example and FIG. 8(c) is a cross-sectional view of the electrode structure of the first conventional example after conducting a heat treatment at 750° C. or more.
Figure 8C:
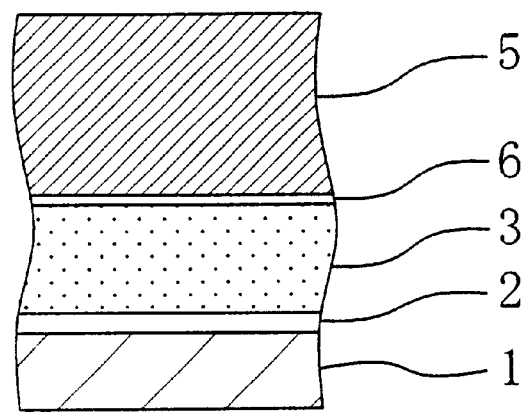
Figure 9A:
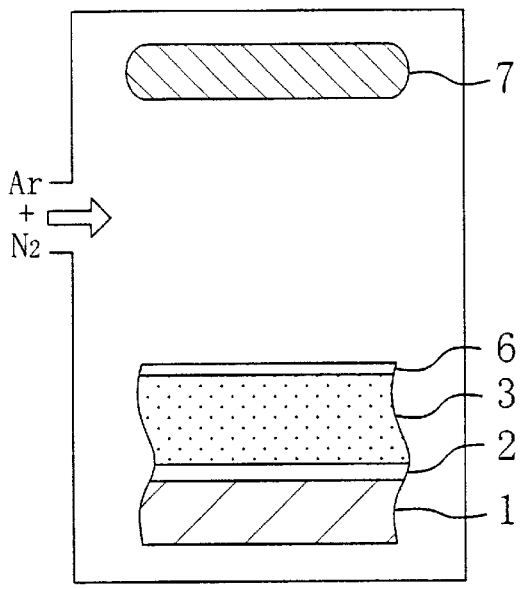
FIGS. 9(a), 9(b) and 9(a) are cross-sectional views for showing procedures in a method of forming the electrode structure of the second conventional example.
Figure 9B:
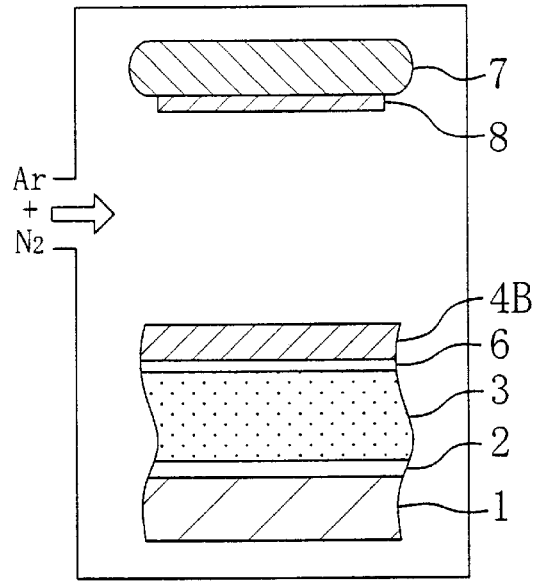
Figure 9C:
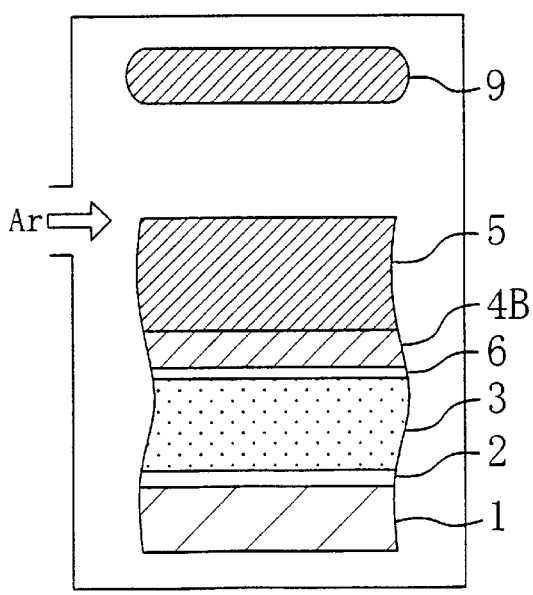
Figure 10A:
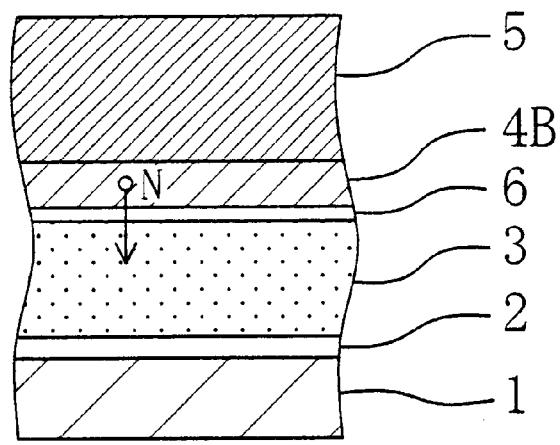
FIGS. 10(a) and 10(b) are cross-sectional views for illustrating a problem of the method of forming the electrode structure of the second conventional method.
Figure 10B:
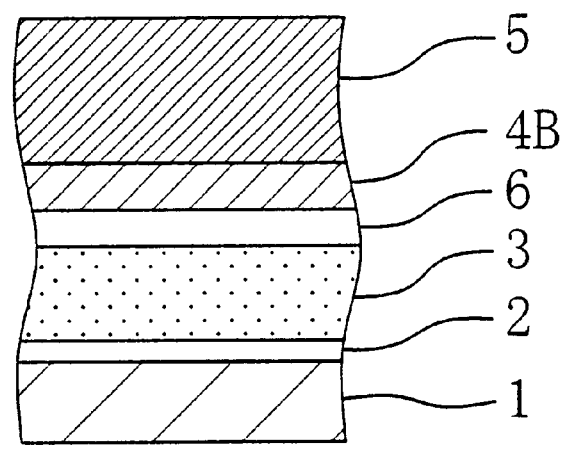
Figure 11:
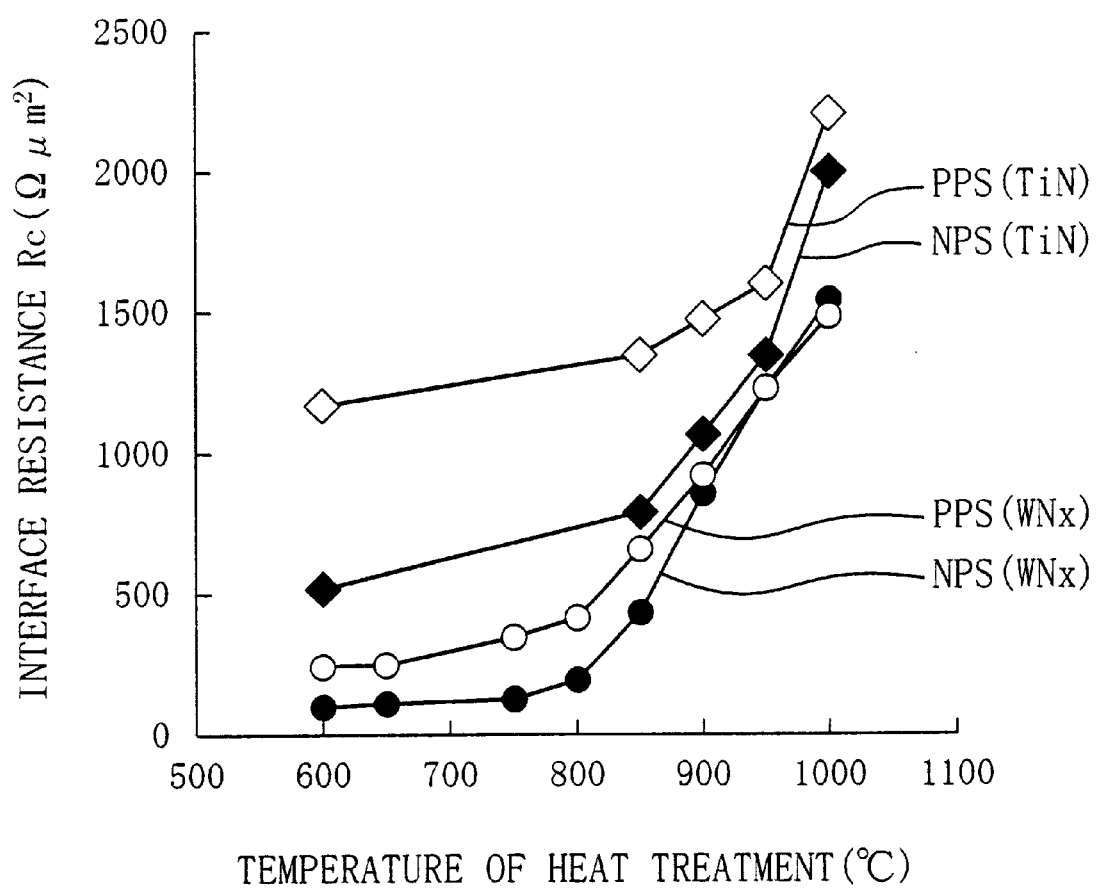
FIG. 11 is a graph for showing the relationship between a temperature of a heat treatment and interface resistance after the heat treatment in gate electrodes formed by the methods of forming the electrode structures of the first and second conventional examples.

FIGS. 7(a) and 7(b) show the relationship between the thickness d of the titanium film 24 and the interface resistance $R_c$ between the polysilicon film 22 and the highmelting-point metal film 28 after the heat treatment in the method of fabricating a semiconductor device of Embodiment 2. This relationship is obtained in depositing the titanium nitride film 25 with a thickness of 10 nm and the tungsten film 28 with a thickness of 40 nm on the titanium film 24. Furthermore, the heat treatment is carried out at a temperature of 975° C. for 30 seconds for activating the low concentration impurity layer 30 and the high concentration impurity layer 33. FIG. 7(*a*) shows the relationship obtained when n-type polysilicon is used as the polysilicon film 22 and FIG. 7(*b*) shows the relationship obtained when p-type polysilicon is used as the polysilicon film 22.

As is understood from FIGS. 7(*a*) and 7(*b*), when the titanium film 24 has a thickness of 2 nm or more, the interface resistance is as low as 200 $\Omega\mu m^2$ or less, and the ohmic property can be attained.

Furthermore, when the titanium film 24 has a thickness of 1 nm, although the ohmic property can be attained, the interface resistance is slightly high. This is because the thickness of the titanium film 24 is so small that the reaction layer 29 of a silicon nitride film has a slightly large thickness.

As a comparative example, a gate electrode is formed under the same conditions as in Embodiment 2 except that the titanium film 24 is not formed. When n-type polysilicon is used as the polysilicon film 22 of this comparative gate electrode, the interface resistance is 1488 $\Omega\mu m^2$ and the ohmic property is not attained, and when p-type polysilicon is used as the polysilicon film, the interface resistance is 1689 $\Omega\mu m^2$ and the ohmic property is not attained.

According to Embodiment 2, even after the heat treatment at 750° C. or more, a titanium silicide layer is never formed and the interface resistance can be lowered, resulting in preventing the degradation in the operation speed of the MOS transistor. Also, the peeling of the tungsten film 28 derived from the formation of a titanium silicide layer can be avoided.

Although a tungsten film is used as the high-melting-point metal film in Embodiments 1 and 2, a molybdenum (Mo) film, a tungsten suicide (WSi$_x$) film or a molybdenum silicide (MoSi$_2$) film can be used instead.

Furthermore, although a titanium nitride film is used as the upper film of the barrier film, another metal nitride film such as a tantalum nitride (TaN) film and a tungsten nitride (WN) film can be used instead.

Although a titanium film is used as the lower film of the barrier film, another metal capable of forming a nitride, such as tantalum (Ta) and tungsten (W), can be used instead.

The upper film and the lower film of the barrier film can be formed from the same metal (such as Ti, Ta and W) or may be formed from different metals. The same metal is preferably used because when the upper film and the lower film of the barrier film are formed from the same metal, they can be continuously formed by using the same target by changing merely the kind of gas to be introduced.

In addition, the silicon substrate can be replaced with a SOI substrate.

What is claimed is:

1. A method of forming an electrode structure comprising the steps of:

depositing a first metal film of a first metal on a silicon-containing film including silicon as a main component;

depositing a second metal film of a nitride of a second metal on said first metal film;

depositing a high-melting-point metal film on said second metal film, whereby obtaining an electrode structure including said silicon-containing film, said first metal film, said second metal film and said high-melting-point metal film; and conducting a heat treatment on said electrode structure at a temperature of 750° C. or more, wherein said first metal film has such a thickness that during said heat treatment, said first metal is nitrided to be changed into a nitride of said first metal due to a diffusion of nitrogen from said second metal film to said first metal film, said nitrogen is acquired by said first metal film, and a silicide layer of said first metal is not formed in a surface portion of said silicon-containing film.

2. The method of forming an electrode structure of claim 1, wherein no silicon nitride film is formed between said silicon-containing film and said first metal film after said heat treatment.

3. The method of forming an electrode structure of claim 1, wherein interface resistance between said silicon-containing film and said high-melting-point metal film is 300 $\Omega\mu m^2$ or less after said heat treatment.

4. The method of forming an electrode structure of claim 1, wherein said first metal and said second metal are the same metal, said first metal film is deposited by sputtering using a target of said same metal, and said second metal film is deposited by sputtering of a nitride film of said same metal formed on said target.

5. The method of forming an electrode structure of claim 1, wherein said first metal and said second metal are both titanium.

6. The method of forming an electrode structure of claim 1, wherein the nitride of said second metal is titanium nitride, tungsten nitride, tantalum nitride or tungsten silicide nitride.

7. A method of fabricating a semiconductor device comprising the steps of:

depositing a polysilicon film on a semiconductor region;

depositing a first metal film of a first metal on said polysilicon film;

depositing a second metal film of a nitride of a second metal on said first metal film;

depositing a high-melting-point metal film on said second metal film, whereby forming a gate electrode including said polysilicon film, said first metal film, said second metal film and said high-melting-point metal film;

forming an impurity layer serving as a source or drain by ion implantation of an impurity with said gate electrode used as a mask; and conducting a heat treatment at a temperature of 750° C. or more for activating said impurity layer, wherein said first metal film has such a thickness that during said heat treatment, said first metal is nitrided to be changed into a nitride of said first metal due to a diffusion of nitrogen from said second metal film to said first metal film, said nitrogen is acquired by said first metal film, and a silicide of said first metal is not formed in a surface portion of said polysilicon film.

8. The method of fabricating a semiconductor device of claim 7, wherein no silicon nitride film is formed between said polysilicon film and said first metal film after said heat treatment.

9. The method of fabricating a semiconductor device of claim 7, wherein said first metal and said second metal are both titanium.

10. The method of forming an electrode structure of claim 1, wherein a silicon nitride film with a thickness of 1.5 nm or less is formed between said silicon-containing film and said first metal film after said heat treatment.

11. The method of fabricating a semiconductor device of claim 7, wherein a silicon nitride film with a thickness of 1.5 nm or less is formed between said polysilicon film and said first metal film after said heat treatment.

* * * * *

UNITED STATES PATENT AND TRADEMARK OFFICE
CERTIFICATE OF CORRECTION

PATENT NO. : 6,509,254 B1
DATED : January 21, 2003
INVENTOR(S) : Michikazu Matsumoto et al.

It is certified that error appears in the above-identified patent and that said Letters Patent is hereby corrected as shown below:

<u>Title page,</u>
Item [56], References Cited, change the issue date for "Chern et al." to -- 8/2001 --;

Signed and Sealed this

Twenty-third Day of March, 2004

JON W. DUDAS
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,509,254 B1 | Page 1 of 1 |
| APPLICATION NO. | : 09/680053 | |
| DATED | : January 21, 2003 | |
| INVENTOR(S) | : Michikazu Matsumoto et al. | |

It is certified that error appears in the above-identified patent and that said Letters Patent is hereby corrected as shown below:

Column 12, line 9 after "first metal film," insert -- wherein sufficient high proportion of --;

Column 12, line 9 after "said nitrogen" insert -- in said second metal film --;

Column 12, line 10 change "and" to -- such that --;

Column 12, line 60 after "first metal film," insert -- wherein sufficient high proportion of --;

Column 12, line 60 after "said nitrogen" insert -- in said second metal film --;

Column 12, line 61 change "and" to -- such that --;

Signed and Sealed this

Fifth Day of June, 2007

JON W. DUDAS
*Director of the United States Patent and Trademark Office*